United States Patent
Gsellmann

Patent Number: 5,346,568
Date of Patent: Sep. 13, 1994

[54] EXPANDING ELECTRICAL INSULATING LAMINATE, METHOD FOR ITS MANUFACTURE AND APPLICATION

[75] Inventor: Helmut Gsellmann, Graz, Austria

[73] Assignee: Isovolta Osterreichische Isolierstoffwerke Aktiengesellschaft, Austria

[21] Appl. No.: 31,835

[22] Filed: Mar. 16, 1993

Related U.S. Application Data

[63] Continuation of Ser. No. 688,577, May 28, 1991, abandoned.

Foreign Application Priority Data

Sep. 28, 1989 [AT] Austria ................ 2265/89

[51] Int. Cl.$^5$ .............. H02K 1/04; H02K 15/02; H02K 15/12
[52] U.S. Cl. ................ 156/83; 156/293; 156/62.2; 156/296; 310/43; 310/45; 310/215; 428/413
[58] Field of Search ........... 156/296, 62.2, 83, 166, 156/293; 428/304.4, 413, 324; 310/45, 43, 215; 366/60, 96, 206

[56] References Cited

U.S. PATENT DOCUMENTS

| | | | |
|---|---|---|---|
| 3,621,092 | 11/1971 | Hofer | 264/120 X |
| 3,759,734 | 9/1973 | Mendelsohn et al. | 428/413 X |
| 4,654,100 | 3/1987 | Yats et al. | 156/246 |
| 4,724,600 | 2/1988 | Studniarz et al. | 310/45 X |
| 4,775,580 | 10/1988 | Dighton | 264/122 X |

Primary Examiner—Jeff H. Aftergut
Attorney, Agent, or Firm—Bacon & Thomas

[57] ABSTRACT

A thermally expanding laminate contains highly elastic reinforcing fibers, such as glass fibers, in the elastically compressed state, and a thermally softening, thermosetting plastic as a binder.

In order to manufacture this laminate, first glass fiber mats are impregnated with a thermosetting plastic and thereupon one or more superposed mats are compressed in a press and raised to temperatures such that the plastic shall soften and the assembly then is cooled while still being compressed and while the plastic is solidifying to form the finished laminate.

The expandable laminate preferably is used for electrically insulating spacers. Illustratively a laminate blank 4 is mounted between neighboring coil parts 5 of a stator of an electrical high-voltage machine. In the ensuing vacuum-pressure molding, which is conventional per se, of the stator to complete the soil insulation, the laminate blanks 4 are heated by the hot impregnation-soaking medium, the plastic of the laminate blanks being softened and these blanks then expand on account of the decompression of their compressed fiber material and entirely fill the gaps between the coil parts 5. The soaking medium totally filling the laminate pores then is jointly cured with the plastic of the laminate with the stator insulation.

5 Claims, 1 Drawing Sheet

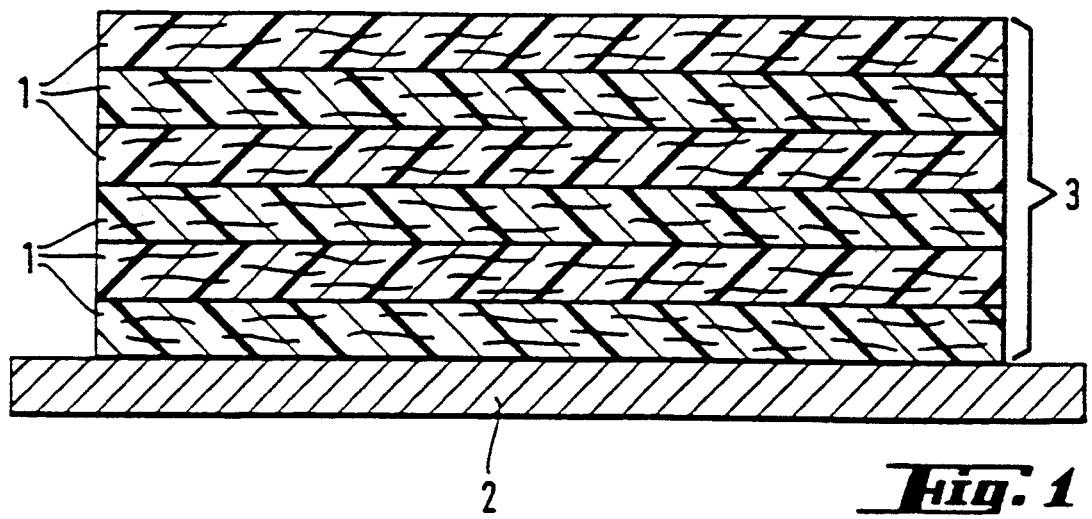
Fig. 1
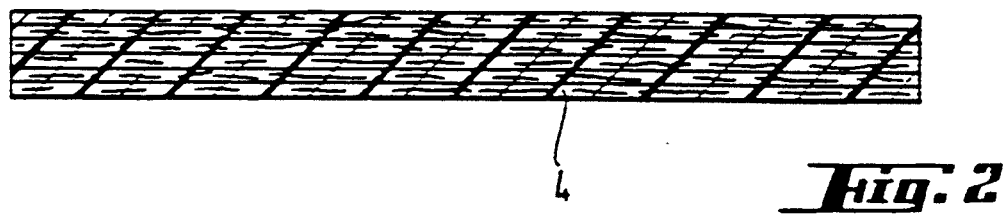
Fig. 2
Fig. 3    Fig. 4
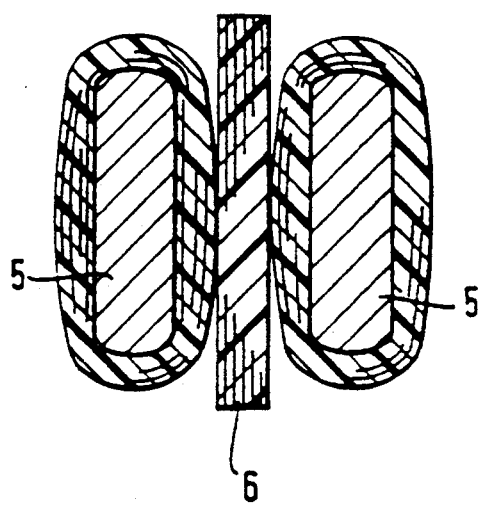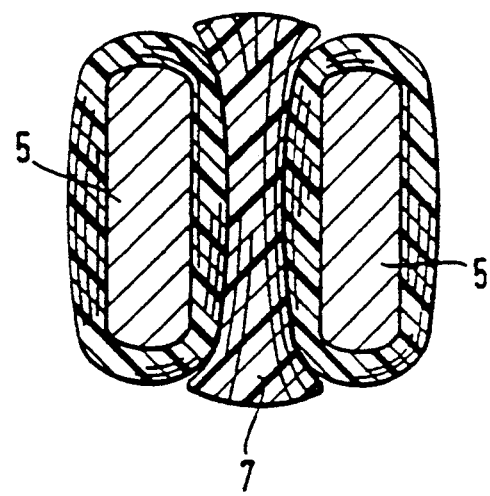

EXPANDING ELECTRICAL INSULATING LAMINATE, METHOD FOR ITS MANUFACTURE AND APPLICATION

This application is a continuation of application Ser. No. 07/688,577, filed May 28, 1991, now abandoned.

TECHNICAL FIELD

The invention concerns an electrical insulating laminate based on plastic and highly elastic reinforcing electrical insulating fibers. Further it concerns an advantageous manufacturing method for the laminate of the invention and its advantageous application.

STATE OF THE ART

Laminates of this kind have been used on a large scale in the manufacture of electrical machinery and devices. Illustratively epoxy-resin laminates standardly known as epoxy fiberglass laminates or epoxy glass fiber mats are used as high-load mechanical and electrical insulating materials. For instance in the construction of high-voltage stators, blanks made of such fiberglass laminates are inserted and fixed in place as electrically insulating spacers between the end windings. Because the gaps between the end windings are irregular in shape, these spacers make contact more or less only at points or along lines.

STATEMENT OF THE INVENTION

The first object of the invention is to create an electrical insulating laminate of the initially cited kind which shall expand when heated and then shall cure and which by its expansion also can fill irregular spaces, further a method for its manufacture. This problem is solved by the laminate 4 of the invention which is characterized in that it contains highly elastic reinforcing fibers such as elastically compressed glass fibers and a binder in the form of a heat-softening, thermosetting plastic which therefore will expand when heated.

One advantageous embodiment of the laminate of the invention is characterized in that the thermosetting plastic is based on an epoxy resin which advantageously is based on a diglycidylether of bisphenol A.

Moreover the laminate of the invention advantageously contains a resin proportion of 10 to 28, preferably 10 to 20% by weight.

The laminate of the invention is made by an advantageous method characterized in that the fiber mats consisting of reinforcing fibers are impregnated with the thermosetting plastic, in that one or more of these impregnated fiber mats are compressed while superposed in a press and raised to a temperature softening the plastic and in that the fiber mats so compressed and heated then are cooled in the compressed state so as to resolidify the plastic and lastly are discharged from the press in the form of a finished laminate 4. The superposed impregnated fiber mats advantageously shall be compressed down to a predetermined thickness.

In an advantageous implementation of the method, a hardening catalyst not yet activated during laminate manufacture shall be added to the thermosetting plastic.

Again one or more of the impregnated fiber mats 1 shall be advantageously compressed in this method in the press at a press-metal support temperature of 110°–155° C.

The invention also relates to an advantageous application of the laminate of the invention, which is characterized in that a piece cut from the laminate is placed in a gap between machine parts or devices and thereupon is heated, the synthetic resin first softening and thereby the laminate expanding on account of the decompression of the elastically compressed fiber material, whereby it will fill said gaps and the plastic thereupon shall cure.

In an advantageous implementation of the application of the invention, the heating is carried out by impregnating the laminate blank in a hot, liquid thermosetting plastic which is the impregnating medium filling the pores of the expanding laminate blank, the thermosetting plastic of the laminate curing simultaneously with the impregnation medium received in the pores of the expanded laminate. Any catalyst contained in the laminate serves at least in predominant part to accelerate the hardening reaction of the thermosetting impregnation medium.

DESCRIPTION OF FIGURES

FIG. 1 shows the impregnated glass fiber mats 1 stacked on each other on a press metal support 2 in six layers to form a mat stack 3 which is 7–8 mm thick.

FIG. 2 shows the finished laminate 4 made by compressing the mat stack 3.

FIG. 3 is a schematic section of two adjacent coil parts at the winding ends 5 of the stator winding of an electric high-voltage machine, a blank 6 of the laminate 4 being mounted in the gap between these two coil parts and being temporarily affixed in adequate manner.

FIG. 4 shows the expanded laminate blank 7 entirely filling the gap between the coil parts 5.

AN EMBODIMENT MODE OF THE INVENTION

In order to manufacture an expansible laminate 2 mm thick, illustratively a strip of fiber glass mat is used with a specific weight of 450 g/m$^2$ consisting of spun, cut, random, low-alkali (E) glass filaments, and of an impregnating resin illustratively composed of 98.4% of an epoxy resin based on a diglycidylether of bisphenol A and of 1.6% of zinc naphthenate as latent accelerator. The addition of the zinc naphthenate offers the additional advantage as regards the further method of lowering the Kofler melting range of the epoxy resin being used and which otherwise is about 120° C., whereby the impregnation resin itself evinces a melting range around 70° C.

Impregnation takes place in an impregnating apparatus wherein the continuously fed-in strip of glass fiber mat is subjected to the dripping of a solution of the impregnating resin in methylethylketone as the solvent onto it and thereupon, when passing through a drying duct, the solvent is evaporated. The strip of glass fibers so impregnated thereupon is segmented into pieces of defined length and stacked.

As schematically indicated by FIG. 1, the impregnated glass fiber mat 1 is stacked into six layers on a press metal support 2 in order to manufacture the laminate. This stack 3 of mats is about 7–8 mm thick and is next moved on the press metal support 2 into a press with press plates that can be heated and cooled again and is compressed (by moving together the press plates against spacer strips) to a thickness of 2 mm. Thereupon the press plates are heated to 120° C. and this temperature is maintained for about 1 hour, In this process the pressed material is thoroughly heated, and the impregnation resin will be softened on account of its low melting range, whereafter it will be flowing and spreading uniformly through the volume of the pressed material. Next the press plates and thereby the pressed material are cooled down to about room temperature so that the impregnation resin solidifies again and the compressed stack of mats is converted into the finished laminate 4 (FIG. 2), which then is discharged from the press. The specific weight of the laminate which is about 2 mm thick is 3,260 g/m$^2$, and its glass fiber content is 80% by weight and its resin content is 20% by weight.

Commercial Applicability

The laminate of the invention is suitable for the construction of high-voltage machines, a laminate blank being inserted between and affixed to the coil parts of the stator winding to serve as an electrically insulating spacer. As shown by FIG. 3, a blank 6 from the laminate 4 is mounted in the gap between the coil parts 5 and will be temporarily affixed in suitable manner. Completion of the stator insulation now takes place in conventional manner by the known vacuum-pressure impregnation procedure. In this procedure the main insulation of the stator winding—which is deposited in the form of porous insulating, mica-based tapes on the winding conductor—is impregnated with a hot, liquid soaking medium, for instance at 70° C. by immersing the stator into the soaking medium under vacuum, said soaking medium illustratively consisting of an epoxy resin based on diglycidylether of bisphenol A with a carboxylic-acid anhydride as the hardener and filling all the pores in the insulation. The stator so impregnated thereupon is subject to another heat treatment in an oven wherein the soaking-medium resin will cure. During this procedure too the laminate blanks 6 affixed to the coil parts 5 are rapidly heated in the liquid soaking medium, whereby the laminate synthetic resin softens due to the heating and the laminate blank 6 will expand on account of the decompression of the elastically compressed fiber material and will entirely fill the gaps between the coil parts 5—FIG. 4. At the same time and in manner similar to the case for the remaining insulation, the pores of the expanded laminate blank 7 are filled. During the subsequent oven heat-treatment, the laminate epoxy resin is cured jointly with the absorbed soaking medium, the zinc naphthenate contained in the laminate acting as accelerator for the curing reaction.

What is claimed is:

1. A method of electrically insulating a device comprising mounting a laminate comprising highly elastic electrically insulating fibers and a binder in the form of a heat softening thermosetting plastic in an amount of 10–28% by weight of the laminate which holds the fibers in a mechanically compressed stated into a space adjacent the device, heating the laminate by soaking the laminate in a hot thermosetting liquid plastic soaking medium such that the laminate expands to fill the space and the thermosetting liquid plastic soaking medium fills the pores of the expanded laminate and curing the expanded laminate and the thermosetting soaking medium.

2. The method defined in claim 1, wherein the laminate contains a catalyst which accelerates the curing of the thermosetting soaking medium.

3. The method defined in claim 1, wherein the heat softening thermosetting plastic is an epoxy resin.

4. The method defined in claim 3, wherein the epoxy resin is derived from a diglycidylether of bisphenol A.

5. The method defined in claim 1, wherein said thermosetting liquid plastic soaking medium consists of an epoxy resin based on diglycidylether of bisphenol A with a carboxylic acid anhydride.

* * * * *